United States Patent
Fournel et al.

(10) Patent No.: US 7,041,227 B2
(45) Date of Patent: May 9, 2006

(54) METHOD FOR REVEALING CRYSTALLINE DEFECTS AND/OR STRESS FIELD DEFECTS AT THE MOLECULAR ADHESION INTERFACE OF TWO SOLID MATERIALS

(75) Inventors: Franck Fournel, Moirans (FR);
Hubert Moriceau, St. Egreve (FR);
Noël Magnea, Moirans (FR)

(73) Assignee: Commissariat a l'Energie Atomique, Paris (FR)

( * ) Notice: Subject to any disclaimer, the term of this patent is extended or adjusted under 35 U.S.C. 154(b) by 17 days.

(21) Appl. No.: 10/398,630

(22) PCT Filed: Oct. 5, 2001

(86) PCT No.: PCT/FR01/03074

§ 371 (c)(1),
(2), (4) Date: Oct. 27, 2003

(87) PCT Pub. No.: WO02/29876

PCT Pub. Date: Apr. 11, 2002

(65) Prior Publication Data
US 2004/0074866 A1 Apr. 22, 2004

(30) Foreign Application Priority Data
Oct. 6, 2000 (FR) .................................. 00 12796

(51) Int. Cl.
*H01L 21/00* (2006.01)
(52) U.S. Cl. ............................ 216/33; 216/20; 216/88; 438/456; 438/694
(58) Field of Classification Search .................. 216/20, 216/33, 88; 438/455, 694, 456
See application file for complete search history.

(56) References Cited

U.S. PATENT DOCUMENTS 5,981,400 A 11/1999 Lo (Continued)

FOREIGN PATENT DOCUMENTS

WO WO 99/05711 2/1999

OTHER PUBLICATIONS

Takao Abe et al., "Dislocation-Free Silicon On Sapphire By Wafer Bonding", Jan. 1994, Jpn J. Appl. Phys. vol. 33, pp. 514-518.
R. Gafiteanu et al., "Twist Boudaries In Silicon: A Model System", Apr. 1993, Inst. Phys. Conf. Ser. No. 134, Section 2, pp. 87-89.

(Continued)

*Primary Examiner*—Shamim Ahmed
(74) *Attorney, Agent, or Firm*—Thelen Reid & Priest LLP

(57) ABSTRACT

A process for permitting defects or stresses in a structure to be revealed, including (a) securing by molecular bonding of a face of a first element containing crystalline material with a face of a second element containing crystalline material, so that the faces have offset crystalline lattices, the securing causing the formation of a lattice of crystalline defects and/or stress fields in a crystalline zone next to the securing interface, and (b) reducing the thickness of one of the elements until at least a thin film is obtained which adheres to the other element, along the securing interface to form the structure, the thickness of the thin film being such that its free face does not reveal the crystalline defect lattice and/or the stress fields, but allowing to perform (c) treatment of the thin film resulting in that its free face reveals the crystalline defect lattice and/or the stress fields.

11 Claims, 2 Drawing Sheets

U.S. PATENT DOCUMENTS 6,197,695 B1 * 3/2001 Joly et al. .................... 438/694
6,261,928 B1 7/2001 Bruel
6,329,070 B1 12/2001 Sass et al.
6,429,094 B1 * 8/2002 Maleville et al. ........... 438/455

OTHER PUBLICATIONS

R. Fournel et al., "Ultra Thin Silicon Films Directly Bonded Onto Silicon Wafers", Apr. 2000, vol. 73, No. 1-3, pp. 42-46.

* cited by examiner

METHOD FOR REVEALING CRYSTALLINE DEFECTS AND/OR STRESS FIELD DEFECTS AT THE MOLECULAR ADHESION INTERFACE OF TWO SOLID MATERIALS

CROSS REFERENCE TO RELATED APPLICATIONS

This application is based on International Patent Application No. PCT/FR01/03074, entitled "Revelation Process of Crystalline Defects and/or Stress Fields at the Molecular Adhesion Interface of Two Solid Materials" by Franck Fournel et al., which claims priority of French Patent Application Serial No. 00 12796, filed on Oct. 06, 2000.

TECHNICAL FIELD

The invention relates to a process permitting defects or stresses in a structure to be revealed, in particular for creating nano-structures or microstructures, this process uses securing by molecular bonding of two crystalline elements.

STATE OF THE PRIOR ART

It is known that when two crystalline materials undergo molecular bonding, then a nanometric or micrometric lattice of stress fields and/or crystalline defects appears at the bonding interface.

The document WO 99/05711 reveals a process using molecular bonding of two crystalline material wafers to obtain a nanometric or micrometric lattice of stress fields and or crystalline defects. By chemical or mechanical reduction of the thickness, one of these wafers is reduced sufficiently in thickness to allow the lattice of stress fields and/or crystalline defects to be revealed. If a material is then deposited onto the film formed by the thinned wafer, this material forms a lattice which is directly dependent on the lattice of stress fields and/or crystalline defects induced at the bonding interface and revealed by the thin film.

Furthermore, it is known that the dislocations present in a crystalline material have higher precipitations of impurities or doping agents. On this subject, we can refer to the following articles:

"Low temperature gettering of trace iron and copper by misfit dislocations in Si/Si (Ge) epitaxy" by D. M. Less et al., published in the Applied Physics Letters, Vol. 65, n° 3, Jul. 18, 1994, pages 350 to 352.

"Gettering of Au to dislocations and cavities in silicon" by J. WONG-LEUNG et al., published in the Applied Physics Letters, Vol. 67, n° 3, Jul. 17, 1995, pages 416 to 418.

According to these articles, the dislocations, which are the preferred place for precipitations, are spread randomly throughout a volume and are not unique or perfectly controlled.

SUMMARY OF THE INVENTION

The purpose of the invention is to employ a nanometric or micrometric lattice of stress fields and or crystalline defects so that it can be used in a different way than the current methods.

The subject of the invention is therefore a process permitting defects or stresses in a structure to be revealed, comprising the following steps:

securing by molecular bonding of a face of a first element containing crystalline material with a face of a second element containing crystalline material, so that said faces have offset crystalline lattices, the securing causing the formation of a lattice of crystalline defects and/or stress fields in the crystalline zone next to the securing interface;

reduction of the thickness of one of the elements until at least a thin film is obtained which adheres to the other element, along the securing interface to form the said structure, the thickness of the thin film being such that its free face does not reveal the crystalline defect lattice and/or the stress fields, the thickness of the thin film also being such that the following step is possible;

treatment of the thin film resulting in that its free face reveals the crystalline defect lattice and/or the stress fields.

The treatment of the thin film may include a heat budget being applied. The heat budget may be applied during an operation, whose purpose is to modify at least one of the properties of the material presented by the free face of the thin film. These properties may include its nature, its surface topology and its internal stress fields. It may also be applied during an operation, whose purpose is to make a deposit on the free face of the thin film.

The treatment of the thin film may include the introduction of chemical species into the thin film. This introduction may be carried out using a method selected from ionic implantation and diffusion. The chemical species introduced may be species which precipitate on the crystalline defects and/or under the influence of the stress fields The treatment of the thin film may include a chemical etching and/or an electrochemical etching and/or a mechanical etching and/or an ionic etching and/or a photochemical etching.

The treatment of the thin film may be carried out locally to reveal one or more zones of the crystalline defect and/or stress field lattice.

If the thickness reduction provides several adhesive thin films, the treatment step may be applied to one or more of said thin films.

BRIEF DESCRIPTION OF THE DRAWINGS

The invention will be easier to understand and other advantages and particular features will become clear upon reading the following description, which is non-restrictive, accompanied by the appended drawings among which.

DETAILED DESCRIPTION OF EMBODIMENTS OF THE INVENTION

Figure 1:
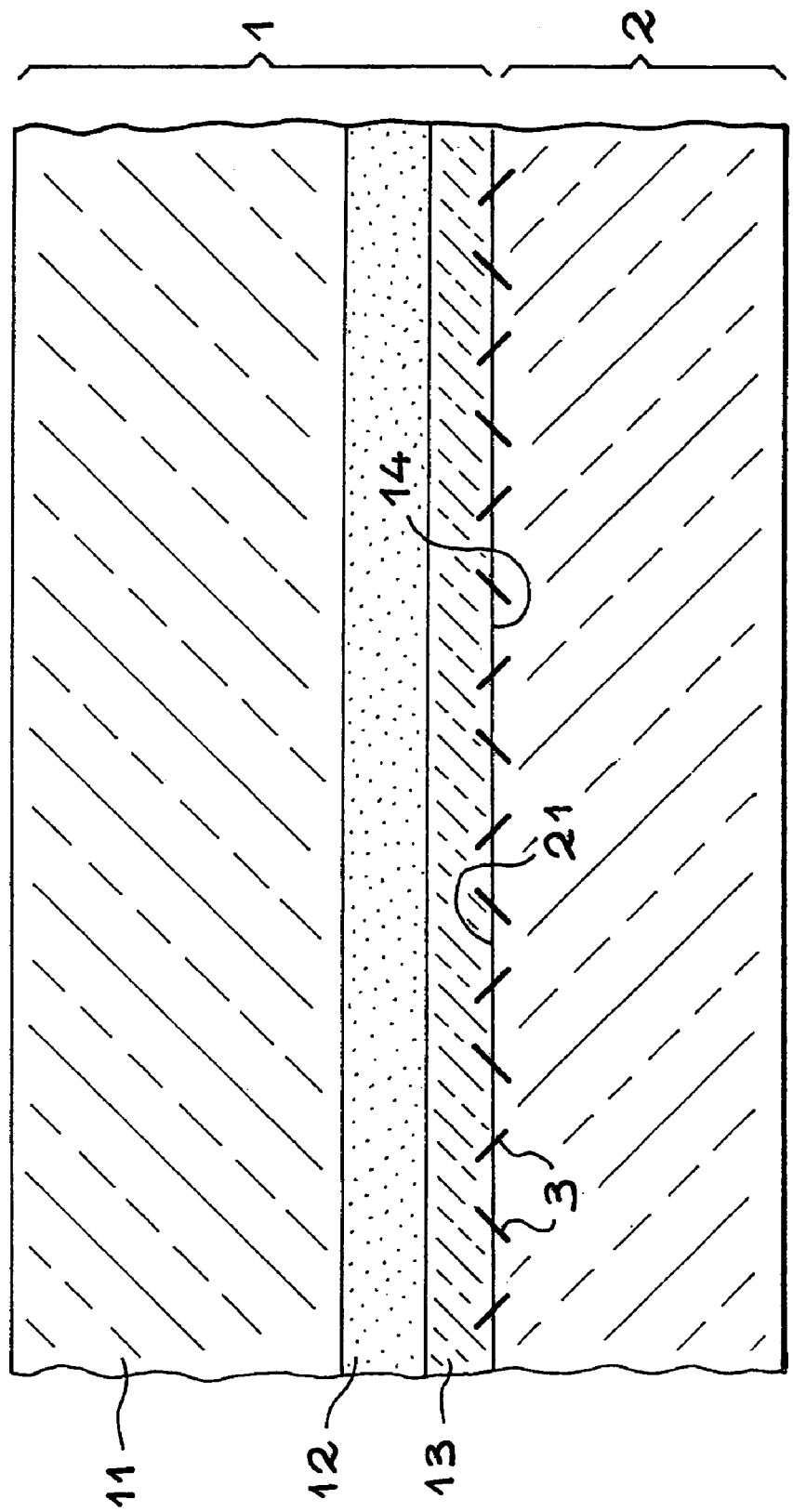
FIG. 1 is a cross sectional view of two substrates, the faces of which that have a crystalline lattice are placed into a secured contact, a crystalline defect lattice and/or stress fields are formed next to the securing interface, in compliance with the first step of the process of the invention.

FIG. 1 is a cross sectional view showing a substrate SOI 1 secured to a silicon wafer 2. The substrate SOI 1 is for example a disc of 4 inches (10.16 cm) in diameter, composed of the superposition of a silicon wafer 11, a layer 12 of $SiO_2$, 400 nm thick, and a layer 13 of silicon 200 nm thick. The layer 13 has a securing face 14. The silicon of the wafer 11 and the silicon of the layer 13 are each P type, doped to $10^{15}$–$10^{16}$ atoms/cm$^3$. The layer 13 has a surface orientated in the (100) direction. The wafer 2, of a diameter of 4 inches (10.16 cm) is also made of type P silicon doped to $10^{15}$–$10^{16}$ atoms/cm$^3$, and has a surface orientated in the (100) direction. The wafer 2, has a securing face 21.

FIG. 1 shows the structure obtained after securing by molecular bonding of face 21 of the wafer 2 on face 14 of the SOI substrate 1. Prior to gluing, the faces 21 and 14 are treated using a known method of the art in order to obtain molecular bonding. The substrate 1 and the wafer 2 are secured so that the faces 14 and 21 present offset crystalline structures as described by document WO 99/05711. The structure may undergo heat treatment to reinforce the bonding between faces 14 and 21.

Securing by molecular bonding causes the formation of a lattice of crystalline defects and/or stress fields as shown symbolically by reference 3 in FIG. 1.

The next step of the process consists of reducing the thickness of the substrate 1. In order to do so, the thickness of the substrate SOI 1 is reduced on its rear face by a mechanical method known in the art. This mechanical reduction of the thickness is for example stopped at more than 10 µm from the securing interface 14/21 and consequently in the silicon wafer 11. The rest of the silicon of the wafer 11 is eliminated for example by a chemical etching using TMAH (trimethylammonium hydroxide) at 80° C. Other techniques to reduce the thickness may also be used. This chemical etching stops on the rear face of the oxide layer 12. The oxide layer 12 is then eliminated by etching using a hydrofluoric acid solution (10% HF: $H_2O$).

Figure 2:
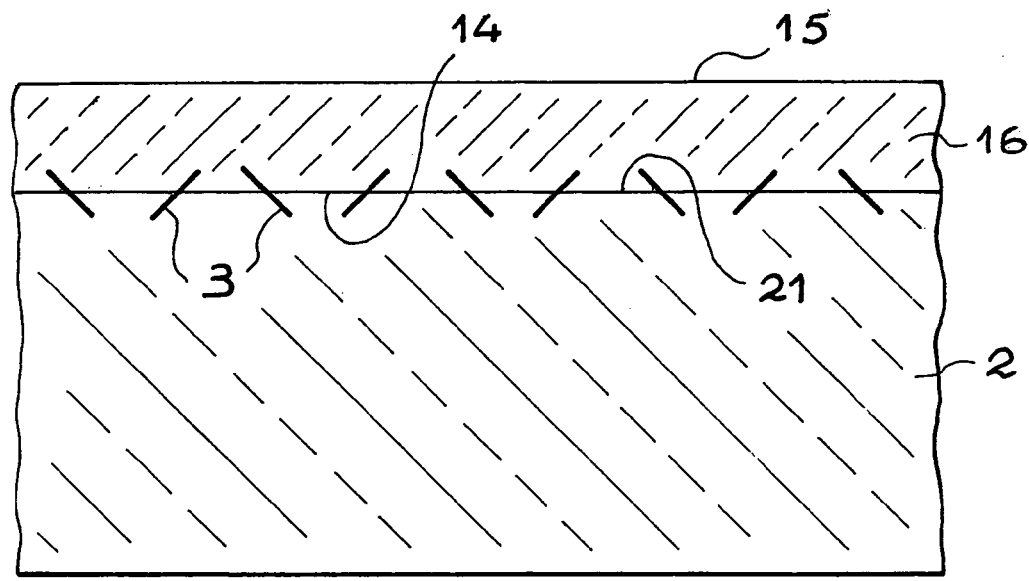
FIG. 2 shows the structure of FIG. 1 after reduction of the thickness of one of the subtrates, in compliance with the second step of the process of the invention.

Then heat treatment is carried out to both strengthen the bonding and to form an oxide layer by consuming part of the silicon of the exposed layer 13. By checking the thickness of the oxide formed, the thickness of the silicon on the remaining layer 13 is brought to around 10 nm to form the thin film 16. This sacrificial oxide is then removed by a HF etching (10% HF: $H_2O$). The structure shown in FIG. 2 is thus achieved. The free surface 15 of the film 16 does not reveal a lattice of crystalline defects or stress fields. Such a lattice remains limited to the neighbouring area of the secured interface 14/21.

Once the thickness has been reduced, depending on the initial substrate, several thin films may be deposited onto the wafer.

The next step of the process consists of treating the thin film 16 so that its free face 15 reveals the lattice of crystalline defects or stress fields next to the securing interface 14/21.

The lattice of crystalline defects or stress fields may be revealed by the application of a heat budget. This heat budget may be applied during annealing in different atmospheres (Nitrogen, Oxygen, Argon or any other gas), or in a vacuum, during oxidation or by a combination of these techniques. The purpose of this heat budget is to cause a change in the volume of the stress zones and/or crystalline defects. This change in volume causes a modification of the topology of the free surface 15 of the film 16. It leads to the appearance at the surface of a lattice of stresses or a periodical topological modification of the surface, depending totally or partially on the stress fields lattice and/or the crystalline defects lattice present at and/or near to the securing interface whose volume has been modified. Moreover, the pitch of the modified topology may be a multiple of the pitch of the stress fields lattice and/or the crystalline defects lattice.

Figure 3:
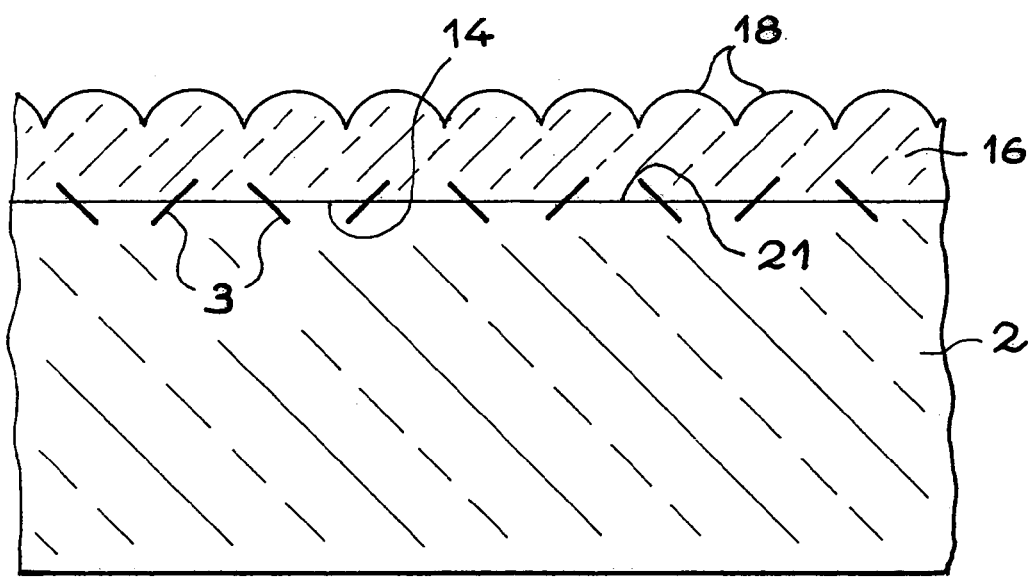
FIG. 3 shows the structure of FIG. 2 after the third step of the invention process has been carried out.

FIG. 3 shows, under reference 18, an example of the topographical modulation of the surface of the film 16 after annealing in a vacuum at a temperature of 800° C. This modulation of the surface is periodical and the period of modulation depends on the period of the dislocation lattices present at the securing interface 14/21, which is to say approximately 10 nm below the free surface of the film 16.

The crystalline defects lattice or the stress fields may also be revealed by the introduction of chemical species into the thin film. These chemical species may come from metallic or magnetic particles. They may be gases, such as hydrogen and/or helium, or one of the other elements that can be introduced into the thin film 16 or the wafer 2, for example Er, Fe, Co, Ni, Mn, Au, Cu. The species may be introduced by diffusion or ionic implantation for example. It may consist of introducing several species in one or more steps.

The introduction of chemical species may be followed, preceded or accompanied at the same time by the application of a heat budget, which may be performed in several phases. This application of a heat budget may, in addition to the different effects mentioned above, facilitate the diffusion of the various species introduced to the crystalline defects. This can permit the volume of the stress fields lattice to be increased or reduced and/or the nature of the crystalline defects part of a lattice to be modified. Advantageously, this modification of the volume and/or nature of the stresses and/or the crystalline defects may have an effect on the surface.

The species introduced can also precipitate on the crystalline defects and/or follow the influence of the stress fields. A buried lattice is then obtained of the species introduced depending totally or partially on the stress fields lattice and/or the crystalline defects lattice. Moreover, the pitch of the lattice of buried species may be a multiple of the pitch of the stress fields lattice and/or the crystalline defects lattice. For example, in the case of copper being introduced, a lattice of nanometric wires may be obtained with a nanometric pitch at an Si/Si interface, that can be made to appear at the surface.

Also, in the case of a magnetic material being introduced, a lattice of magnetic pins or wires may be obtained which can subsequently serve, by the effect of the magnetic field lattice, to organise the magnetic materials at the surface for example. This lattice of pins or wires may also be directly used, whether buried or not in the film or the substrate.

The crystalline defect lattice or stress fields may also be revealed by at least one chemical and/o electrochemical and/or ionic and or photochemical and/or mechanical etching. For example, this may be RIE etching or ionic bombardment. This treatment may occur before and/or after and/or at the same time as the application of a heat budget, leading to the modification of the stress and/or crystalline defects lattice. There is indeed a modification of the stresses and/or crystalline defects in that the volume of the extension of the stress fields and/or crystalline defects is modified. The location of this etching depends totally or partially on the stress fields lattice and/or the crystalline defects lattice. Moreover, the pitch of this localised etching may be a multiple of the pitch of the stress fields lattice and/or the crystalline defects lattice. For example, the formation of porous silicon by an electrochemical etching with HF will reveal a porosity or roughness depending totally or partially on the stress fields lattice and/or the crystalline defects lattice. Moreover, the pitch of this roughness may be a multiple of the pitch of the stress fields lattice and/or the crystalline defects lattice.

This modification of the volume may then be used to organise the material deposited on this surface. This deposit may be made using one of the deposit techniques selected for example from the gaseous techniques (for example, epitaxy, CVD, molecular jet techniques, spraying), by liquid techniques (e.g. deposit of materials in solution, liquid phase epitaxy (LPE), depositing of a molten polymer) or solid techniques (e.g. depositing of a solid aggregate). This deposited material may be amorphous (e.g. nitride oxide) metallic (e.g. Co, Fe, Ni, Mn, Au, Cu or other metals), semiconductor (e.g. Si, Ge, SiC, II-IV or III-V composites such as GaN, InP, AsFa, InGaAs, etc.), superconductor, organic or insulating (e.g. diamond, graphite or other insulating materials).

The invention claimed is:

1. Process permitting defects or stresses in a structure to be revealed, comprising the following steps:

securing by molecular bonding of a face (14) of a first element (1) containing crystalline material with a face (21) of a second element (2) containing crystalline material, so that said faces have offset crystalline lattices, the securing causing the formation of a lattice of crystalline defects (3) and/or stress fields in the crystalline zone next to the securing interface;

reduction of the thickness of one (1) of the elements until at least a thin film (16) is obtained which adheres to the other element (2), along the securing interface (14/21) to form said structure, the thickness of the thin film (16) being such that its free face (15) does not reveal the crystalline defect lattice and/or the stress fields, the thickness of the thin film (16) also being such that the following step is possible;

treatment of the thin film (16) resulting in that its free face reveals the crystalline defect lattice (18) and/or the stress fields.

2. Process of claim 1 characterised in that the treatment of the thin film (16) includes the application of a heat budget.

3. Process of claim 2 characterised in that the heat budget is applied during an operation whose purpose is to modify at least one of the properties of the material presented by the free face of the thin film.

4. Process of claim 3 characterised in that these properties may include its nature, its surface topology and its internal stress fields.

5. Process of claim 2 characterised in that the heat budget is applied during an operation, whose purpose is to make a deposit on the free face of the thin film.

6. Process of claim 1 characterised in that the treatment of the thin film includes the introduction of chemical species into the thin film.

7. Process of claim 6 characterised in that the chemical species are introduced using a method selected from ionic implantation and diffusion.

8. Process of claim 6 characterised in that the chemical species introduced are species which precipitate on the crystalline defects and/or under the influence of the stress fields.

9. Process of claim 1 characterised in that the treatment of the thin film includes a chemical etching and/or an electro-chemical etching and/or a mechanical etching and/or an ionic etching and/or a photochemical etching.

10. Process of claim 1 characterised in that the treatment of the thin film is carried out locally to reveal one or more zones of the crystalline defect and/or stress field lattice.

11. Process of claim 1 characterised in that the thickness reduction step provides several adhesive thin films, and that the treatment step is applied to one or more of said thin films.

* * * * *